United States Patent
Kim et al.

(10) Patent No.: US 10,168,845 B2
(45) Date of Patent: Jan. 1, 2019

(54) TOUCH INPUT DEVICE INCLUDING DISPLAY MODULE FORMED WITH PRESSURE SENSING ELECTRODE AND PRESSURE SENSING ELECTRODE FORMING METHOD

(71) Applicant: HiDeep Inc., Bundang-gu, Seongnam-si, Gyeonggi-do (KR)

(72) Inventors: Taehwan Kim, Gyeonggi-do (KR); Sangsic Yoon, Gyeonggi-do (KR)

(73) Assignee: HiDeep Inc., Gyeonggi-do (KR)

( * ) Notice: Subject to any disclaimer, the term of this patent is extended or adjusted under 35 U.S.C. 154(b) by 0 days.

(21) Appl. No.: 15/222,688

(22) Filed: Jul. 28, 2016

(65) Prior Publication Data

US 2017/0031479 A1 Feb. 2, 2017

(30) Foreign Application Priority Data

Jul. 29, 2015 (KR) ................ 10-2015-0106984

(51) Int. Cl.
*G06F 3/044* (2006.01)
*G06F 3/041* (2006.01)
(Continued)

(52) U.S. Cl.
CPC .......... *G06F 3/044* (2013.01); *G02F 1/13338* (2013.01); *G06F 3/0412* (2013.01);
(Continued)

(58) Field of Classification Search
CPC ...... G06F 3/044; G06F 3/0412; G06F 3/0414; G02F 1/13338
See application file for complete search history.

(56) References Cited

U.S. PATENT DOCUMENTS 9,201,105 B2  12/2015  Iida et al.
2003/0150714 A1  8/2003  Cropper et al.
(Continued)

FOREIGN PATENT DOCUMENTS

CN  103365518 A  10/2013
CN  104145240 A  11/2014
(Continued)

OTHER PUBLICATIONS

Office Action dated Jun. 6, 2017 in related Japanese Appl. 2016-144086 (3 pgs.).

(Continued)

*Primary Examiner* — Lisa Landis
(74) *Attorney, Agent, or Firm* — Foley & Lardner LLP (57) ABSTRACT

A touch input device capable of detecting a touch pressure is provided that includes: a display module having a pressure electrode which is formed on a back side of the display panel and is for detecting the pressure; and a reference potential layer which is formed separately from the pressure electrode. The touch input device detects the touch pressure on the basis of a capacitance change amount according to a change of a distance between the pressure electrode and the reference potential layer. As a result of this, the touch input device becomes thinner, has a reduced manufacturing cost thereof, and detects a touch position and touch pressure without deteriorating the visibility and optical transmittance of the display module.

14 Claims, 8 Drawing Sheets

(51) Int. Cl.
*G02F 1/1333* (2006.01)
*H01L 27/32* (2006.01)

(52) U.S. Cl.
CPC .......... *G06F 3/0414* (2013.01); *H01L 27/323* (2013.01); *G06F 2203/04103* (2013.01); *G06F 2203/04105* (2013.01)

(56) References Cited

U.S. PATENT DOCUMENTS

| | | | |
|---|---|---|---|
| 2008/0062139 A1* | 3/2008 | Hotelling | G02F 1/13338 345/173 |
| 2010/0024573 A1 | 2/2010 | Daverman et al. | |
| 2010/0253645 A1* | 10/2010 | Bolender | G06F 3/0414 345/174 |
| 2013/0234734 A1* | 9/2013 | Iida | G06F 3/044 324/661 |
| 2013/0257784 A1 | 10/2013 | Vandermeijden et al. | |
| 2015/0015803 A1* | 1/2015 | Wang | G06F 3/044 349/12 |
| 2015/0153887 A1 | 6/2015 | Kim et al. | |
| 2016/0170543 A1 | 6/2016 | Kawamura | |

FOREIGN PATENT DOCUMENTS

| | | | |
|---|---|---|---|
| EP | 1 335 436 | A2 | 8/2003 |
| EP | 1335436 | * | 8/2003 |
| JP | 2003-243169 | A | 8/2003 |
| JP | 2008-083497 | A | 4/2008 |
| JP | 2011-086191 | A | 4/2011 |
| JP | 2014-194591 | A | 10/2014 |
| JP | 201414194591 | * | 10/2014 |
| JP | 2015-106417 | A | 6/2015 |
| KR | 2011-0022727 | A | 3/2011 |
| KR | 2015-0066885 | A | 6/2015 |
| WO | WO-2013/132736 | A1 | 9/2013 |
| WO | WO-2015/041268 | A1 | 3/2015 |

OTHER PUBLICATIONS

Extended European Search Report dated Dec. 6, 2016 in related EP Appl. No. 16181288.8 (10 pgs.).

Office Action dated Jun. 30, 2016 in related Korean Appl. No. 10-2015-0106984 (4 pgs.).

Office Action dated Aug. 22, 2017 in related Japanese Appl. No. 2016-144086 (3 pgs.).

Office Action dated Jul. 10, 2018 in related EP Appl. No. 16181288.8 (7 pgs.).

Office Action dated Sep. 4, 2018 in related Chinese Appl. 201610589774.1 (14 pgs.).

* cited by examiner

Front side

Back side

TOUCH INPUT DEVICE INCLUDING DISPLAY MODULE FORMED WITH PRESSURE SENSING ELECTRODE AND PRESSURE SENSING ELECTRODE FORMING METHOD

CROSS-REFERENCE TO RELATED PATENT APPLICATION

The present application claims the benefit of Korean Patent Application Serial No. 10-2015-0106984 filed Jul. 29, 2015; the entireties of which are all incorporated herein by reference.

BACKGROUND

Field

The present disclosure relates to a touch input device including a display module having a pressure electrode formed thereon and a pressure electrode forming method, and more particularly to a touch input device capable of detecting a touch pressure and a method for forming a pressure electrode for the same.

Description of the Related Art

Various kinds of input devices are being used to operate a computing system. For example, the input device includes a button, key, joystick and touch screen. Since the touch screen is easy and simple to operate, the touch screen is increasingly being used in operation of the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and the touch position on the touch screen and analyzes the touch, and thus, performs the operations in accordance with the analysis.

Here, there is a requirement for a touch input device capable of detecting a touch position of the touch on the touch screen but also the pressure magnitude of the touch without degrading the performance of a display module.

SUMMARY

The present invention provides a touch input device which is capable of detecting a touch position and a touch pressure and includes a display module having a pressure electrode formed thereon, and a method for forming the pressure electrode. Also, the present invention provides a touch input device which becomes thinner, has a reduced manufacturing cost thereof, and includes a display module having a pressure electrode formed thereon, and a method for forming the pressure electrode.

The present invention provides a touch input device which includes a display module having a pressure electrode formed thereon and is capable of detecting a touch position and a touch pressure without deteriorating the visibility and optical transmittance of the display module, and a method for forming the pressure electrode.

One embodiment is a touch input device capable of detecting a touch pressure is provided that includes: a display panel having a pressure electrode which is formed on a back side of the display panel and is for detecting the pressure; and a reference potential layer which is formed separately from the pressure electrode. The touch input device detects the touch pressure on the basis of a capacitance change amount according to a change of a distance between the pressure electrode and the reference potential layer.

The pressure electrode may include a drive electrode and a receiving electrode. The capacitance change amount may be a mutual capacitance change amount between the drive electrode and the receiving electrode, which is based on the change of the distance between the pressure electrode and the reference potential layer.

The capacitance change amount may be a self-capacitance change amount of the pressure electrode, which is based on the change of the distance between the pressure electrode and the reference potential layer.

The display panel may include an upper substrate layer made of glass or plastic and a lower substrate layer made of glass or plastic. A liquid crystal layer or an organic layer may be provided between the upper substrate layer and the lower substrate layer. The pressure electrode may be formed on a bottom surface of the lower substrate layer.

In the display panel, after the pressure electrode is formed on the lower substrate layer, either the liquid crystal layer or the organic layer, and the upper substrate layer may be formed.

The touch input device may further include a touch sensor panel which detects a touch position. The touch sensor panel may be attached on the display panel or may be disposed within the display panel.

The display panel may be an LCD panel. The touch input device may include a backlight unit between the display panel and the reference potential layer.

The display panel may be an OLED panel.

The touch input device may include: a cover layer which is disposed on the display panel; and a substrate which is disposed under the display panel and includes the reference potential layer. The distance may be maintained only by a support member disposed only on a circumference of the substrate. The pressure electrode may not be formed on the circumference. When a pressure is applied to a touch surface, the cover layer and the display panel are bent, so that the distance may be changed. The distance may be changed according to a magnitude of the pressure.

Another embodiment is a method for forming a pressure electrode on a display panel including an upper substrate layer made of glass or plastic and a lower substrate layer made of glass or plastic, and a liquid crystal layer or an organic layer between the upper substrate layer and the lower substrate layer. The method includes: forming the pressure electrode on a bottom surface of the lower substrate layer; forming an insulator on the formed pressure electrode; forming a protective layer on the lower substrate layer in which the pressure electrode and the insulator have been formed, and inverting the lower substrate layer; forming a liquid crystal layer or an organic layer on a top surface of the inverted lower substrate layer; and forming the upper substrate layer on the liquid crystal layer or the organic layer.

The forming the pressure electrode may be performed by using any one of etching processes using photolithography, an etching resist, or etching paste.

The pressure electrode may be for detecting a capacitance change amount according to a change of a distance between the pressure electrode and a reference potential layer spaced apart from the pressure electrode at a predetermined distance.

The pressure electrode may include a drive electrode and a receiving electrode. The pressure electrode may detect a mutual capacitance change amount between the drive electrode and the receiving electrode, which is based on the change of a distance between the pressure electrode and the reference potential layer.

The pressure electrode may detect a self-capacitance change amount according to the change of a distance between the pressure electrode and the reference potential layer.

According to the touch input device including the display module having the pressure electrode formed thereon in accordance with the above configuration, and the method for forming the pressure electrode, the touch input device becomes thinner, has a reduced manufacturing cost thereof, and detects a touch position and touch pressure without deteriorating the visibility and optical transmittance of the display module.

DETAILED DESCRIPTION

Specific embodiments of the present invention will be described in detail with reference to the accompanying drawings. The specific embodiments shown in the accompanying drawings will be described in enough detail that those skilled in the art are able to embody the present invention. Other embodiments other than the specific embodiments are mutually different, but do not have to be mutually exclusive. Additionally, it should be understood that the following detailed description is not intended to be limited.

The detailed descriptions of the specific embodiments shown in the accompanying drawings are intended to be read in connection with the accompanying drawings, which are to be considered part of the entire written description. Any reference to direction or orientation is merely intended for convenience of description and is not intended in any way to limit the scope of the present invention.

Specifically, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

Terms such as "attached," "affixed," "connected," "coupled," "interconnected," and similar refer to a relationship wherein structures are attached, connected or fixed to one another either directly or indirectly through intervening structures, as well as both movable or rigid attachments or relationships, unless expressly described otherwise.

A touch input device according to an embodiment of the present invention can be used in portable electronic products such as a smartphone, a smartwatch, a tablet PC, a laptop computer, personal digital assistants (PDA), an MP3 player, a camera, a camcorder, an electronic dictionary, etc., but also in home appliances such as a home PC, TV, DVD, a refrigerator, an air conditioner, a microwave oven, etc. Also, the pressure detectable touch input device including a display module in accordance with the embodiment can be used without limitation in all of the products that require a device for display and input, such as an industrial control device, a medical equipment, etc.

Hereinafter, the touch input device according to the embodiment of the present invention will be described with reference to the accompanying drawings. While the following description shows a capacitance type touch sensor panel 100 and a pressure detection module 400, the capacitance type touch sensor panel 100 and the pressure detection module 400 which are capable of detecting a touch position and/or a touch pressure in any manner can be also applied.

Figure 1:
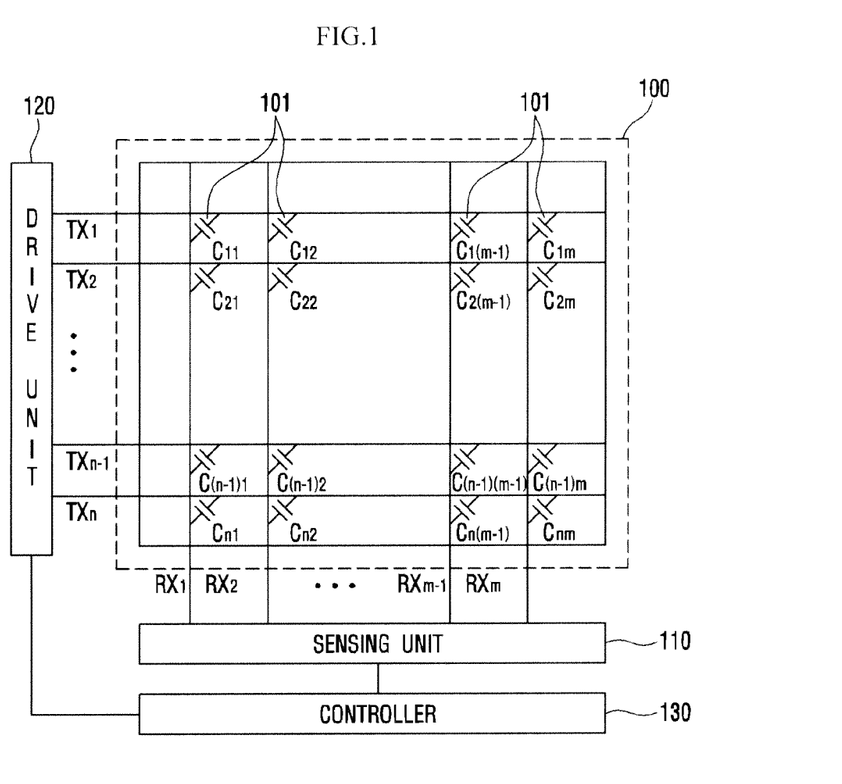
FIG. 1 is a schematic view of a configuration of a capacitance type touch sensor panel and the operation thereof in accordance with an embodiment of the present invention.

FIG. 1 is a schematic view of a configuration of the capacitance type touch sensor panel 100 and the operation thereof in accordance with an embodiment of the present invention. Referring to FIG. 1, the touch sensor panel 100 according to the embodiment may include a plurality of drive electrodes TX1 to TXn and a plurality of receiving electrodes RX1 to RXm, and may include a drive unit 120 which applies a drive signal to the plurality of drive electrodes TX1 to TXn for the purpose of the operation of the touch sensor panel 100, and a sensing unit 110 which detects the touch and the touch position by receiving a sensing signal including information on the capacitance change amount changing according to the touch on the touch surface of the touch sensor panel 100.

As shown in FIG. 1, the touch sensor panel 100 may include the plurality of drive electrodes TX1 to TXn and the plurality of receiving electrodes RX1 to RXm. While FIG. 1 shows that the plurality of drive electrodes TX1 to TXn and the plurality of receiving electrodes RX1 to RXm of the touch sensor panel 100 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

As shown in FIG. 1, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Also, the plurality of drive electrodes TX1 to TXn and the plurality of receiving electrodes RX1 to RXm may be formed in different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may include at least any one of silver ink, copper, and carbon nanotube (CNT). Also, the drive electrode TX and the receiving electrode RX may be made of metal mesh or nano silver.

The drive unit 120 according to the embodiment of the present invention may apply a drive signal to the drive electrodes TX1 to TXn. In the embodiment of the present invention, one drive signal may be sequentially applied at a time to the first drive electrode TX1 to the n-th drive electrode TXn. The drive signal may be applied again repeatedly. This is only an example. The drive signal may be applied to the plurality of drive electrodes at the same time in accordance with the embodiment.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the drive signal has been applied, thereby detecting whether or not the touch has occurred and the touch position. For example, the sensing signal may be a signal coupled by the capacitance (Cm) 101 generated between the receiving electrode RX and the drive electrode TX to which the drive signal has been applied. As such, the process of sensing the drive signal applied from the first drive electrode TX1 to the n-th drive electrode TXn through the receiving electrodes RX1 to RXm can be referred to as a process of scanning the touch sensor panel 100.

For example, the sensing unit 110 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (CM) 101, and then converts the integrated current signal into voltage. The sensing unit 110 may further include an analog to digital converter (ADC) (not shown) which converts the integrated data by the receiver into digital data. Later, the digital data may be input to a processor (not shown) and processed to obtain information on the touch on the touch sensor panel 100. The sensing unit 110 may include the ADC and processor as well as the receiver.

A controller 130 may perform a function of controlling the operations of the drive unit 120 and the sensing unit 110. For example, the controller 130 generates and transmits a drive control signal to the drive unit 120, so that the drive signal can be applied to a predetermined drive electrode TX1 at a predetermined time. Also, the controller 130 generates and transmits the drive control signal to the sensing unit 110, so that the sensing unit 110 may receive the sensing signal from the predetermined receiving electrode RX at a predetermined time and perform a predetermined function.

In FIG. 1, the drive unit 120 and the sensing unit 110 may constitute a touch detection device (not shown) capable of detecting whether or not the touch has occurred on the touch sensor panel 100 according to the embodiment and the touch position. The touch detection device according to the embodiment may further include the controller 130. The touch detection device according to the embodiment may be integrated and implemented on a touch sensing integrated circuit (IC) in a touch input device 1000 including the touch sensor panel 100. The drive electrode TX and the receiving electrode RX included in the touch sensor panel 100 may be connected to the drive unit 120 and the sensing unit 110 included in the touch sensing IC (not shown) through, for example, a conductive trace and/or a conductive pattern printed on a circuit board, or the like. The touch sensing IC may be placed on a circuit board on which the conductive pattern has been printed, for example, a first printed circuit board (hereafter, referred to as a first PCB). According to the embodiment, the touch sensing IC (not shown) may be mounted on a main board for operation of the touch input device 1000.

As described above, a capacitance (C) with a predetermined value is generated at each crossing of the drive electrode TX and the receiving electrode RX. When an object such as finger approaches close to the touch sensor panel 100, the value of the capacitance may be changed. In FIG. 1, the capacitance may represent a mutual capacitance (Cm). The sensing unit 110 senses such electrical characteristics, thereby being able to sense whether the touch has occurred on the touch sensor panel 100 or not and the touch position. For example, the sensing unit 110 is able to sense whether the touch has occurred on the surface of the touch sensor panel 100 comprised of a two-dimensional plane consisting of a first axis and a second axis and/or the touch position.

More specifically, when the touch occurs on the touch sensor panel 100, the drive electrode TX to which the drive signal has been applied is detected, so that the position of the second axial direction of the touch can be detected. Likewise, when the touch occurs on the touch sensor panel 100, a capacitance change is detected from the reception signal received through the receiving electrode RX, so that the position of the first axial direction of the touch can be detected.

The mutual capacitance type touch sensor panel as the touch sensor panel 100 has been described in detail in the foregoing. However, in the touch input device 1000 according to the embodiment of the present invention, the touch sensor panel 100 for detecting whether or not the touch has occurred and the touch position may be implemented by using not only the above-described method but also any touch sensing method like a self-capacitance type method, a surface capacitance type method, a projected capacitance type method, a resistance film method, a surface acoustic wave (SAW) method, an infrared method, an optical imaging method, a dispersive signal technology, and an acoustic pulse recognition method, etc.

In the touch input device 1000 according to the embodiment, the touch sensor panel 100 for detecting the touch position may be positioned outside or inside a display module 200.

The display module 200 of the touch input device 1000 according to the embodiment may be a display panel included in a liquid crystal display (LCD), a plasma display panel (PDP), an organic light emitting diode (OLED), etc. Accordingly, a user may perform the input operation by touching the touch surface while visually identifying an image displayed on the display panel. Here, the display module 200 may include a control circuit which receives an input from an application processor (AP) or a central processing unit (CPU) on a main board for the operation of the touch input device 1000 and displays the contents that the user wants on the display panel. The control circuit may be mounted on a second printed circuit board (hereafter, referred to as a second PCB). Here, the control circuit for the operation of the display panel 200 may include a display panel control IC, a graphic controller IC, and a circuit required to operate other display panels 200.

FIGS. 2A to 2E are conceptual views showing a relative position of the touch sensor panel with respect to the display module in a touch input device according to the embodiment.

First, referring to FIGS. 2A to 2C, a relative position of the touch sensor panel 100 with respect to the display module 200 using an LCD panel will be described.

Figure 2A:
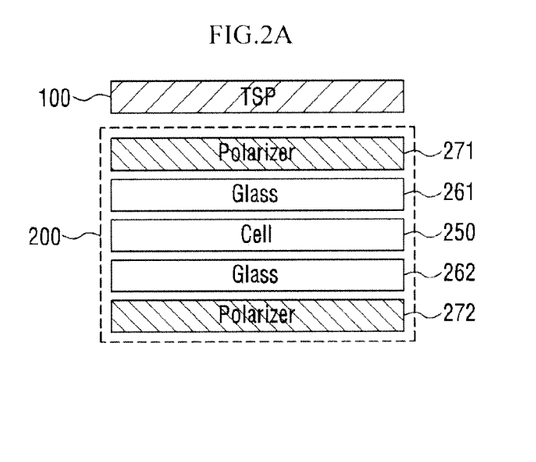
FIGS. 2A to 2E are conceptual views showing a relative position of the touch sensor panel with respect to various display modules in a touch input device according to the embodiment.
Figure 2B:
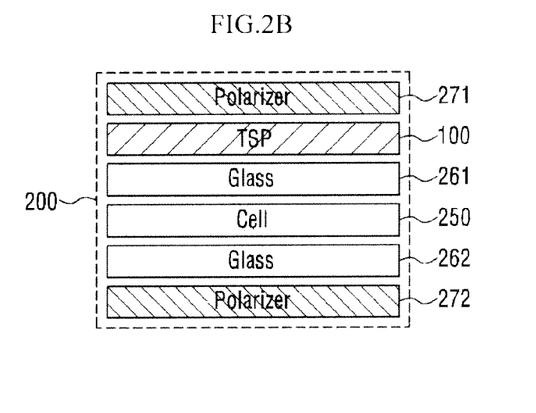
Figure 2C:
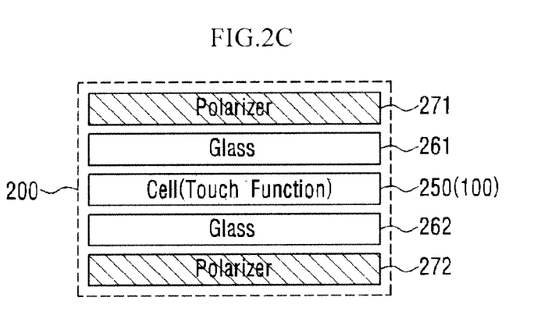

In this specification, while the reference numeral 200 designates the display module, the reference numeral 200 may designate the display panel as well as the display module in FIGS. 2A to 2E and the descriptions thereof. As shown in FIGS. 2A to 2C, the LCD panel may include a liquid crystal layer 250 including a liquid crystal cell, a first glass layer 261 and a second glass layer 262 which are disposed on both sides of the liquid crystal layer 250 and include electrodes, a first polarizer layer 271 formed on a side of the first glass layer 261 in a direction facing the liquid crystal layer 250, and a second polarizer layer 272 formed on a side of the second glass layer 262 in the direction facing the liquid crystal layer 250. Here, the first glass layer 261 may be a color filter glass, and the second glass layer 262 may be a TFT glass.

It is clear to those skilled in the art that the LCD panel may further include other configurations for the purpose of performing the displaying function and may be transformed.

FIG. 2A shows that the touch sensor panel 100 of the touch input device 1000 is disposed outside the display module 200. The touch surface of the touch input device 1000 may be the surface of the touch sensor panel 100. In FIG. 2A, the top surface of the touch sensor panel 100 is able to function as the touch surface. Also, according to the embodiment, the touch surface of the touch input device 1000 may be the outer surface of the display module 200. In FIG. 2A, the bottom surface of the second polarizer layer 272 of the display module 200 is able to function as the touch surface. Here, in order to protect the display module 200, the bottom surface of the display module 200 may be covered with a cover layer (not shown) such as glass.

FIGS. 2B and 2C show that the touch sensor panel 100 of the touch input device 1000 is disposed within the display panel 200. Here, in FIG. 2B, the touch sensor panel 100 for detecting the touch position is disposed between the first glass layer 261 and the first polarizer layer 271. Here, the touch surface of the touch input device 1000 is the outer surface of the display module 200. The top surface or bottom surface of the display module 200 in FIG. 2B may be the touch surface. FIG. 2C shows that the touch sensor panel 100 for detecting the touch position is included in the liquid crystal layer 250. Here, the touch surface of the touch input device 1000 is the outer surface of the display module 200. The top surface or bottom surface of the display module 200 in FIG. 2C may be the touch surface. In FIGS. 2B and 2C, the top surface or bottom surface of the display module 200, which can be the touch surface, may be covered with a cover layer (not shown) such as glass.

In the foregoing, it has been described that whether or not the touch has occurred on the touch sensor panel 100 according to the embodiment of the present invention and/or the touch position are detected. Also, it is possible to detect not only whether the touch has occurred or not and/or the touch position but also the magnitude of the touch pressure by using the touch sensor panel 100 according to the embodiment. Additionally, it is also possible to detect the magnitude of the touch pressure by further including a pressure detection module detecting the touch pressure separately from the touch sensor panel 100.

Figure 2D:
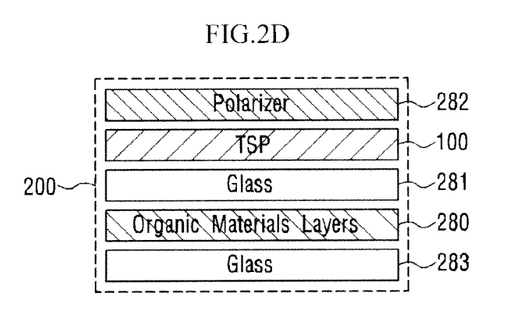
Figure 2E:
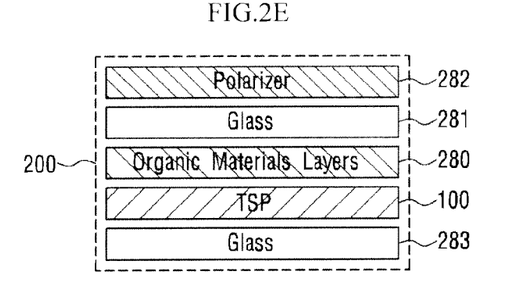

Next, a relative position of the touch sensor panel 100 with respect to the display module 200 using an OLED panel will be described with reference to FIGS. 2D and 2E. In FIG. 2D, the touch sensor panel 100 is located between a polarizer layer 282 and a first glass layer 281. In FIG. 2E, the touch sensor panel 100 is located between an organic layer 280 and a second glass layer 283. Here, the first glass layer 281 may be comprised of an encapsulation glass, and the second glass layer 283 may be comprised of a TFT glass. Since the touch sensing has been described above, only the other configurations thereof will be briefly described.

The OLED panel is a self-light emitting display panel which uses a principle in which current flows through a fluorescent or phosphorescent organic thin film and then electrons and electron holes are combined in the organic layer, so that light is generated. The organic matter constituting the light emitting layer determines the color of the light.

Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

As shown in FIGS. 2d and 2e, basically, the OLED (particularly, AM-OLED) panel includes the polarizer layer 282, the first glass layer 281, the organic layer 280, and the second glass layer 283. Here, the first glass layer 281 may be a cover glass and the second glass layer 283 may be a TFT glass. However, they are not limited to this.

Also, the organic layer 280 may include a hole injection layer (HIL), a hole transport layer (HTL), an electron injection layer (EIL), an electron transport layer (ETL), and an light-emitting layer (EML).

Briefly describing each of the layers, HIL injects electron holes and uses a material such as CuPc, etc. HTL functions to move the injected electron holes and mainly uses a material having a good hole mobility. Arylamine, TPD, and the like may be used as the HTL. The EIL and ETL inject and transport electrons. The injected electrons and electron holes are combined in the EML and emit light. The EML represents the color of the emitted light and is composed of a host determining the lifespan of the organic matter and an impurity (dopant) determining the color sense and efficiency. This just describes the basic structure of the organic layer 280 include in the OLED panel. The present invention is not limited to the layer structure or material, etc., of the organic layer 280.

The organic layer 280 is inserted between the anode (not shown) and a cathode (not shown). When the TFT becomes an on-state, a driving current is applied to the anode and the electron holes are injected, and the electrons are injected to the cathode. Then, the electron holes and electrons move to the organic layer 280 and emit the light.

Up to now, the touch position detection by the touch sensor panel 100 according to the embodiment of the present invention has been described. Additionally, through use of the touch sensor panel 100 according to the embodiment of the present invention, it is possible to detect the magnitude of the touch pressure as well as whether the touch has occurred or not and/or where the touch has occurred. Also, the pressure detection module for detecting the touch pressure is further included separately from the touch sensor panel 100, so that it is possible to detect the magnitude of the touch pressure. Hereafter, touch pressure detection using the pressure detection module will be described in detail.

The touch input device 1000 according to the embodiment is able to detect the touch position through the above-described touch sensor panel 100 and to detect the touch pressure by disposing the pressure detection module 400 between the display module 200 and a substrate 300.

Hereinafter, the touch pressure detection which is performed by the pressure detection module 400 of the touch input device 1000 according to the embodiment and the structure for the touch pressure detection will be described.

Figure 3A:
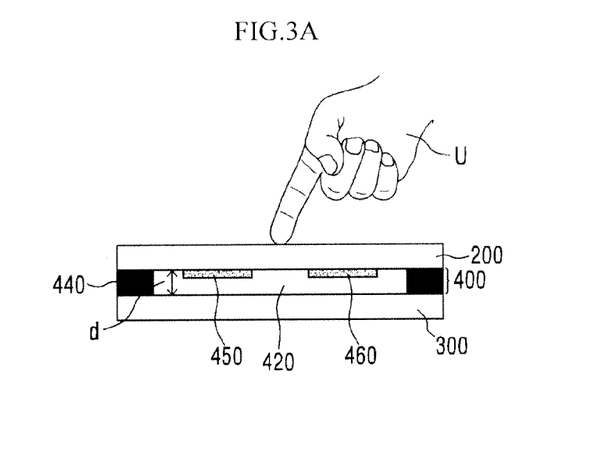
FIGS. 3A and 3B show a method for detecting a touch pressure by detecting a mutual capacitance change amount in the touch input device according to the embodiment, and a structure of the same.
Figure 3B:
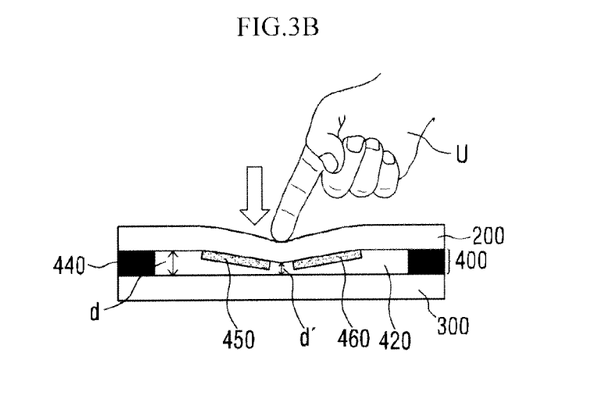

FIGS. 3A and 3B show a method for detecting a touch pressure by detecting a mutual capacitance change amount, and a structure of the same. While the pressure detection module 400 shown in FIGS. 3A and 3B includes a spacer layer 420 composed of, for example, an air-gap, the spacer layer 420 may be made of a shock absorbing material or may be filled with a dielectric material in accordance with another embodiment.

The pressure detection module 400 may include a pressure electrode 450 and 460 disposed within the spacer layer 420. Here, the pressure electrode 450 and 460 may be formed under the display module 200 in various ways. This will be described below in more detail. Since the pressure electrode 450 and 460 is included in the rear side of the display panel, the pressure electrode 450 and 460 can be made of any one of a transparent material or an opaque material.

In order to maintain the spacer layer 420, an adhesive tape 440 with a predetermined thickness may be formed along the circumference of the upper portion of the substrate 300. The adhesive tape 440 may be formed on the entire circumference of the substrate 300 (e.g., four sides of a quadrangle) or may be formed on some of the circumference. For example, the adhesive tape 440 may be attached to the top surface or to the bottom surface of the display module 200. The adhesive tape 440 may be a conductive tape in order that the substrate 300 and the display module 200 have the same electric potential. Also, the adhesive tape 440 may be a double adhesive tape. In the embodiment of the present invention, the adhesive tape 440 may be made of an inelastic material. In the embodiment of the present invention, when a pressure is applied to the display module 200, the display module 200 may be bent. Therefore, the magnitude of the touch pressure can be detected even though the adhesive tape 440 is not transformed by the pressure. Further, in the embodiment, a means for maintaining the spacer layer 420 is not limited to the adhesive tape 440. In another embodiment, various means as well as the adhesive tape 440 can be used.

As shown in FIGS. 3A and 3B, the pressure electrode for detecting the pressure includes the first electrode 450 and the second electrode 460. Here, any one of the first electrode 450 and the second electrode 460 may be a drive electrode, and the other may be a receiving electrode. A drive signal is applied to the drive electrode, and a sensing signal may be obtained through the receiving electrode. When voltage is applied, the mutual capacitance may be generated between the first electrode 450 and the second electrode 460.

FIG. 3B is a cross sectional view of the pressure detection module 400 when a pressure is applied by an object U. The bottom surface of the display module 200 may have a ground potential in order to block the noise. When the pressure is applied to the surface of the touch sensor panel 100 by the object U, the touch sensor panel 100 and the display module 200 may be bent.

As a result, a distance "d" between the pressure electrode pattern 450 and 460 and a reference potential layer having the ground potential may be reduced to "d'". In this case, due to the reduction of the distance "d", fringing capacitance is absorbed in the bottom surface of the display module 200, so that the mutual capacitance between the first electrode 450 and the second electrode 460 may be reduced. Therefore, the magnitude of the touch pressure can be calculated by obtaining the reduction amount of the mutual capacitance from the sensing signal obtained through the receiving electrode.

In the touch input device 1000 according to the embodiment of the present invention, the display module 200 may be bent by the applied pressure of the touch. The display module 200 may be bent in such a manner as to show the biggest transformation at the touch position. When the display module 200 is bent according to the embodiment, a position showing the biggest transformation may not match the touch position. However, the display module 200 may be shown to be bent at least at the touch position. For example, when the touch position approaches close to the border, edge, etc., of the display module 200, the most bent position of the display module 200 may not match the touch position. However, the display module 200 may be shown to be bent at least at the touch position.

Here, the top surface of the substrate 300 may also have the ground potential in order to block the noise. Therefore, in order to prevent the substrate 300 and the pressure electrode 450 and 460 from being short-circuited, the pressure electrode 450 and 460 may be formed on an insulation layer.

Figure 4:
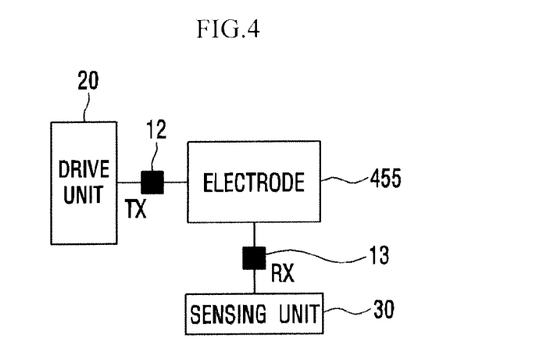
FIGS. 4, 5A, and 5B show a method for detecting a touch pressure by detecting a self-capacitance change amount in the touch input device according to the embodiment, and a structure of the same.
Figure 5A:
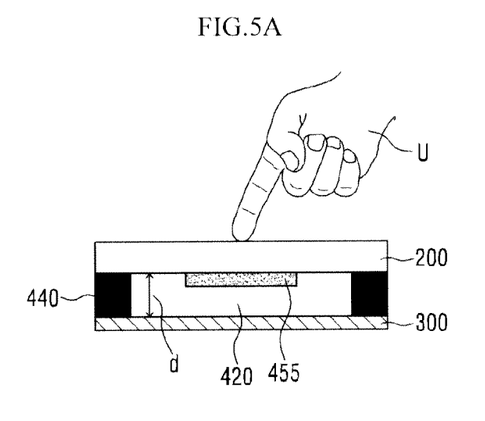
Figure 5B:
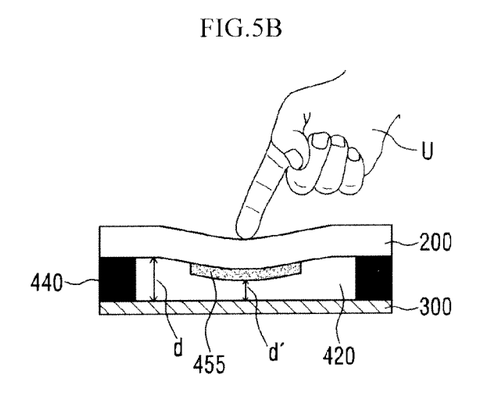

FIGS. 4, 5A, and 5B show a method for detecting the touch pressure by detecting a self-capacitance change amount, and a structure of the same.

The pressure detection module 400 for detecting the self-capacitance change amount uses a pressure electrode 455 formed on the bottom surface of the display module 200. When a drive signal is applied to the pressure electrode 455, the pressure electrode 455 receives a signal including information on the self-capacitance change amount and then detects the touch pressure.

The drive unit 20 applies a drive signal to the pressure electrode 455, and the sensing unit 30 measures a capacitance between the pressure electrode 455 and the reference potential layer 300 (e.g., substrate) having a reference potential through the pressure electrode 455, thereby detecting whether or not the touch pressure is applied and the magnitude of the touch pressure.

The drive unit 20 may include a clock generator (not shown) and a buffer, generate a drive signal in the form of a pulse, and apply to the pressure electrode 455. However, this is just an example. The drive unit may be implemented by means of various elements, and the shape of the drive signal may be variously changed.

The drive unit 20 and the sensing unit 30 may be implemented by an integrated circuit and may be formed on one chip. The drive unit 20 and the sensing unit 30 may constitute a pressure detector.

In order that the capacitance change amount is easily detected between the pressure electrode 455 and the reference potential layer 300, the pressure electrode 455 may be formed such that a larger facing surface between the pressure electrode 455 and the reference potential layer 300. For example, the pressure electrode 455 may be formed in a plate-like pattern.

With regard to the detection of the touch pressure in the self-capacitance type method, here, one pressure electrode 455 is taken as an example for description. However, the plurality of electrodes are included and a plurality of channels are constituted, so that it is possible to configure that the magnitude of multi pressure can be detected according to multi touch.

The capacitance between the pressure electrode 455 and the reference potential layer is changed by the change of the distance between the pressure electrode 455 and the reference potential layer 300. Then, the sensing unit 30 detects information on the capacitance change, and thus the touch pressure is detected.

FIG. 5A is a cross sectional view showing the display module 200 and the pressure detection module 400 in the touch input device 1000.

As shown in FIGS. 3A and 3B, the pressure electrode 455 may be disposed apart from the reference potential layer 300 at a predetermined distance "d". Here, a material which is deformable by the pressure applied by the object U may be disposed between the pressure electrode 455 and the reference potential layer 300. For instance, the deformable material disposed between the pressure electrode 455 and the reference potential layer 300 may be air, dielectrics, an elastic body and/or a shock absorbing material.

When the object U presses the touch surface (herein, the top surface of the display module 200 or the top surface of the touch sensor panel 100), the pressure electrode 455 and the reference potential layer 300 become close to each other by the applied pressure, and the spaced distance "d" between them becomes smaller.

FIG. 5B shows that the pressure is applied by the object U and then the display module 200 and the pressure detection module 400 are bent downwardly. As the distance between the pressure electrode 455 and the reference potential layer 300 is reduced from "d" to "d'", the capacitance is changed. Specifically, the self-capacitance generated between the pressure electrode 455 and the reference potential layer 300 is increased. The thus generated self-capacitance change amount is, as described above, measured by the sensing unit 30. Through this, it is possible to determine whether or not the touch pressure is applied and the magnitude of the touch pressure.

Figure 6A:
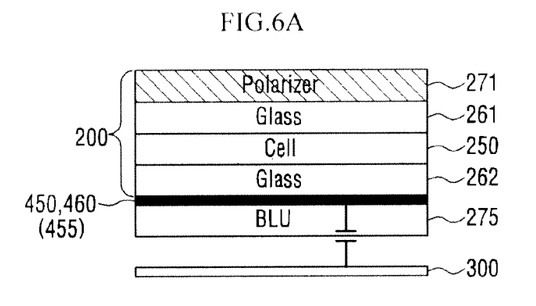
FIGS. 6A and 6B are cross sectional views showing embodiments of pressure electrode 450, 460, or 455 formed on various display modules 200 in the touch input device according to the embodiment.
Figure 6B:
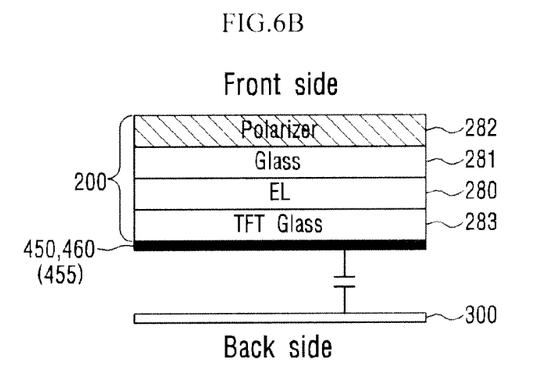

The pressure electrode 450, 460, or 455 for detecting the capacitance change amount may be formed on the back side of the display module 200. FIGS. 6A and 6B are cross sectional views showing embodiments of pressure electrode 450, 460, or 455 formed on various display modules 200.

First, FIG. 6A shows the pressure electrode 450, 460, or 455 formed on the back side of the display module 200 using the LCD panel. Here, when the touch pressure is detected based on the mutual capacitance change amount, the drive electrode 450 and the receiving electrode 460 are formed on the back side of the display module 200 (in more detail, the bottom surface of the second glass layer 262). When the touch pressure is detected based on the self-capacitance change amount, the pressure electrode 455 is formed on the back side of the display module (in more detail, the bottom surface of the second glass layer 262).

Although a relative position of the touch sensor panel 100 has been omitted in FIG. 6A, the embodiments of FIGS. 2A to 2C may be applied. Briefly describing, the touch sensor panel 100 may be, as shown in FIG. 2A, disposed outside the display module 200. Also, the touch sensor panel 100 may be, as shown in FIG. 2B or 2C, disposed within the display module 200 in such a manner as to be disposed between the first glass layer 261 and the first polarizer layer 271 or to be included within the liquid crystal layer 250.

In the embodiment of FIG. 6A, the pressure electrode 450, 460, or 455 may be formed on the back side of the display module 200. More specifically, the pressure electrode 450, 460, or 455 may be formed on the bottom surface of the second glass layer 262. Here, a pattern may be formed on the pressure electrode 450, 460, or 455 by using a display process. This will be described later with reference to FIGS. 7A to 7D.

Meanwhile, the LCD panel further includes a backlight unit 275. In FIG. 6A, the backlight unit 275 may be included under the second glass layer 262 on which the pressure electrode 450, 460, or 455 has been formed. However, this is just an embodiment. The backlight unit 275 may be configured in various ways.

Also, the reference potential layer 300 which is used to detect the touch pressure based on the capacitance change amount may be formed separately from the pressure electrode 450, 460, or 455 by a predetermined distance.

Next, FIG. 6B shows the pressure electrode 450, 460, or 455 formed on the back side of the display module 200 using the OLED panel (particularly, AM-OLED panel). Here, when the touch pressure is detected based on the mutual capacitance change amount, the drive electrode 450 and the receiving electrode 460 are formed on the back side of the display module 200 (in more detail, the bottom surface of the second glass layer 262). When the touch pressure is detected based on the self-capacitance change amount, the pressure electrode 455 is formed on the back side of the display module (in more detail, the bottom surface of the second glass layer 262).

Although a relative position of the touch sensor panel 100 has been omitted in FIG. 6B, the embodiments of FIGS. 2D to 2E may be applied. Briefly describing, the touch sensor panel 100 may be, as shown in FIGS. 2D and 2E, disposed within the display module 200 in such a manner as to be disposed between the first glass layer 281 and the first polarizer layer 282 or to be included between the organic layer 280 and the second glass layer 283.

In the embodiment of FIG. 6B, the pressure electrode 450, 460, or 455 may be formed on the back side of the display module 200. More specifically, the pressure electrode 450, 460, or 455 may be formed on the bottom surface of the second glass layer 262. Here, a pattern may be formed on the pressure electrode 450, 460, or 455 by using a display process. This will be described later with reference to FIGS. 7A to 7D.

Meanwhile, since the LCD panel does not require the backlight unit, only the reference potential layer 300 may be formed separately from the pressure electrode 450, 460, or 455 by a predetermined distance.

Hereinafter, a display process of forming the pressure electrode 450, 460, or 455 on the back side of the second glass layer 283 will be described. FIGS. 7A to 7D are views showing a process of forming the pressure electrode on the back side of the display module in the touch input device according to the embodiment.

Figure 7A:
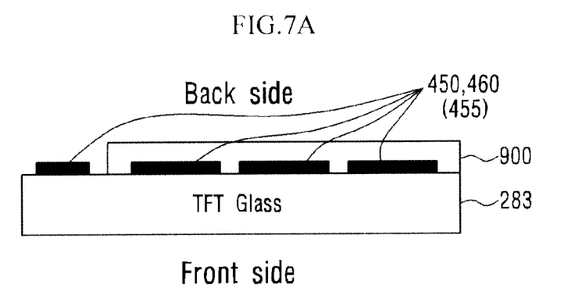
FIGS. 7A to 7D are views showing a process of forming the pressure electrode on the bottom surface of the display module in the touch input device according to the embodiment.

First, as shown in FIG. 7A, the second glass layer 283 is inverted and the pressure electrode 450, 460, or 455 is formed on the back side of the second glass layer 283. There are a variety of methods for forming the pressure electrode 450, 460, or 455. Several of the methods will be described.

Firstly, the electrode is formed by photolithography. First, the second glass layer 283 is inverted. Here, a cleaning process of removing impurities covered on the surface of the second glass layer 283 by using de-ionized water may be performed in advance. Then, a metallic material which is available as the pressure electrode 450, 460, or 455 is deposited on the bottom surface of the second glass layer 283 by physical vapor deposition or chemical vapor deposition. The metallic material may be Al, Mo, AlNd, MoTi, ITO, etc. Next, through use of a process such as spin coating, slit die coating, screen printing, dry film resist (DFR) laminating, etc., a photoresist is coated on the bottom surface of the second glass layer 283. The bottom surface of the second glass layer 283 to which the photoresist has been applied is exposed to light by using ultraviolet (UV). Here, if a positive photoresist (positive PR) is used at this time, the portion exposed to light is washed out by a developer due to chemical decomposition after being exposed to light. If a negative PR is used, the portion exposed to light is chemically combined with the light and a portion which has not been exposed to light is washed out by a developer after being exposed to light. The pattern exposed to light is developed by using a developer, and the photoresist of the portion exposed to light is removed. Here, an aqueous solution mixed with alkali such as sodium sulfite, sodium carbonate, etc., may be used as the developer. Next, a circuit is formed by melting the pattern of the film of the pressure electrode 450, 460, or 455 by means of chloride mixed gas, hydrofluoric acid, acetic acid, etc. Then, a pattern is formed by an etching process, and the photoresist remaining on the surface of the second glass layer 283 is removed. Lastly, impurities on the surface of the second glass layer 283 are removed by using de-ionized water again. As a result, the pressure electrode 450, 460, or 455 is formed. Through this method, a clean line of the pattern can be obtained and a fine pattern can be formed.

Secondly, the electrode is formed by using an etching resist. The etching resist refers to a film applied with the intention of partially preventing the etching or the material of the film. Organic matter, inorganic matter, metal, etc., can be used as the etching resist. First, impurities on the surface of the second glass layer 283 are removed by using de-ionized water. Then, a metallic material which is available as the pressure electrode 450, 460, or 455 is deposited on the bottom surface of the second glass layer 283 by physical vapor deposition or chemical vapor deposition. The metallic material may be Al, Mo, AlNd, MoTi, ITO, etc. Then, the etching resist is coated on the second glass layer 283 by screen printing, gravure coating inkjet coating, etc. After the etching resist is coated, a drying process is performed and etching process is performed. That is, the pattern portion of the pressure electrode 450, 460, or 455 deposited on the bottom surface of the second glass layer 283 is melted by an etching solution such as chloride mixed gas, hydrofluoric acid, acetic acid, etc., so that a circuit is formed. Then, the etching resist remaining on the surface of the second glass layer 283 is removed. This method does not need an exposure system, so that the electrode can be formed at a relatively low cost.

Thirdly, the electrode is formed by etching paste. When a metallic material is deposited on the bottom surface of the second glass layer 283, the etching paste is coated on the second glass layer 283 by using screen printing, gravure coating inkjet coating, etc. Then, in order to heighten the etch rate of the etching paste, the second glass layer 283 is heated at a high temperature of 80 to 120° C. for approximately 5 to 10 minutes. Then, a cleaning process is performed, and thus, the pressure electrode 250, 260, or 255 is formed on the bottom surface of the second glass layer 283. However, unlike this, after the heating process is performed, a process of completely drying the etching paste can be considered to be included. The third method has a simple process and a reduced material cost. Also, when the drying process is further included, a fine pattern can be formed.

Through the above-described method, when the pressure electrode 450, 460, or 455 is formed on the bottom surface of the second glass layer 283, an insulator 900 is formed. This functions to protect the pressure electrode 450, 460, or 455 formed on the bottom surface of the second glass layer 283. The insulator 900 may be formed by the above-described method. Briefly describing, the insulator is deposited on the pressure electrode 450, 460, or 455 by physical vapor deposition or chemical vapor deposition, and the photoresist is coated and dried. Then, the exposure process is performed on the photoresist, and then the photoresist is etched. Lastly, a photoresist strip process of removing the remaining photoresist is performed, so that the electrode pattern is completed. Here, SiNx, SiOx, etc., may be used as the material of the insulator.

Figure 7B:
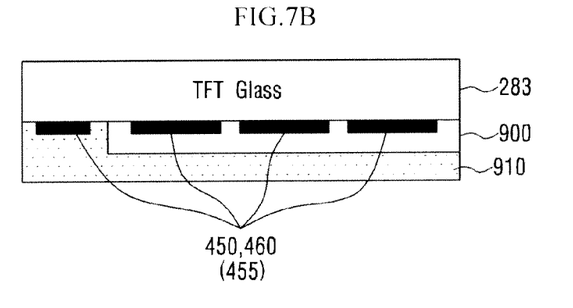

In the next place, in order to protect the pattern of the pressure electrode 450, 460, and 455 during the process, a protective layer 910 is formed. The protective layer 910 may be formed by coating or attaching. Here, for the purpose of protecting a component such as TFT, etc., which has a low hardness, it is desirable that the protective layer 910 should be made of a material having a hardness high enough to protect each layer. FIG. 7B shows that after the protective layer 910 is formed, the second glass layer 283 is inverted into its original position.

Figure 7C:
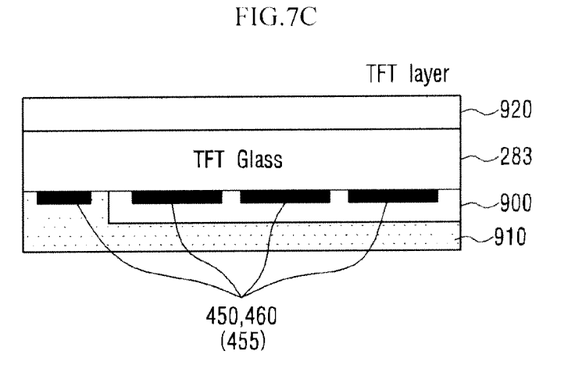

FIG. 7C shows that the configuration of the display module 200 which is stacked on the top surface of the second glass layer 283 is formed. Since FIG. 7C assumes the display module 200 including the OLED panel, a TFT layer 920 is shown to be formed. The TFT layer 920 includes basic components included in the OLED panel (particularly, AM-OLED panel). That is, the TFT layer 920 may include a TFT electrode as well as the cathode, organic layer, and anode, which have been described above with regard to the OLED panel. Also, various elements (e.g., over coat (OC), passivation (PAS), inter-layer dielectric (ILD), gate insulator (GI), light shield (LS), or the like) for stacking the components may be formed. The various elements may be formed by a variety of OLED panel manufacturing processes.

Unlike this, when the display module 200 uses an LCD module, various elements including the liquid crystal layer may take the place of the TFT layer 920 of FIG. 7C.

Figure 7D:
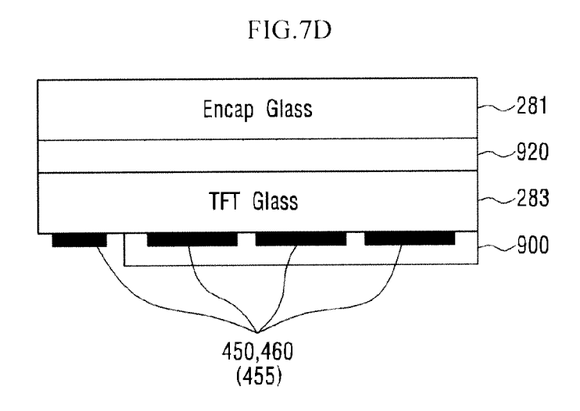

Finally, when the first glass layer 281 is, as shown in FIG. 7D, formed on the TFT layer 920 and the protective layer 910 formed in FIG. 7B is removed chemically or physically, the display module 200 having the pressure electrode 450, 460, or 455 formed on the back side thereof may be manufactured.

In the foregoing, the process of manufacturing the display module 200 having the pressure electrode 450, 460, or 455 formed thereon has been described with reference to FIGS. 7A to 7D. However, the order of the process may be changed or any one step in the process may be omitted. In other words, although the order of FIG. 7A to 7D may be the most optimal process, the scope of the present invention is not limited to the order.

Through the above-described method, when the pressure electrode 450, 460, or 455 is formed on the back side of the display module 200 using the LCD panel or OLED panel, the touch input device 1000 capable of detecting the touch pressure can be thinner. Additionally, it is possible to reduce the manufacturing cost of the touch input device.

The features, structures and effects and the like described in the embodiments are included in at least one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

What is claimed is:

1. A touch input device capable of detecting a touch pressure, the touch input device comprising:
    a display panel having a pressure electrode which is formed on a back side of the display panel and is for detecting the pressure;
    a reference potential layer which is formed separately from the pressure electrode; and
    a substrate which is disposed under the display panel and comprises the reference potential layer,
    wherein the touch input device detects the touch pressure on the basis of a capacitance change amount according to a change of a distance between the pressure electrode and the reference potential layer,
    wherein when no pressure is applied to the display panel, the distance between the pressure electrode which is formed on the back side of the display panel and the reference potential layer is maintained by a support member disposed only on a circumference of the substrate, and
    wherein the support member is made of an inelastic material.

2. The touch input device of claim 1,
    wherein the pressure electrode comprises a drive electrode and a receiving electrode,
    and wherein the capacitance change amount is a mutual capacitance change amount between the drive electrode and the receiving electrode, which is based on the change of the distance between the pressure electrode and the reference potential layer.

3. The touch input device of claim 1, wherein the capacitance change amount is a self-capacitance change amount of the pressure electrode, which is based on the change of the distance between the pressure electrode and the reference potential layer.

4. The touch input device of claim 1,
    wherein the display panel comprises an upper substrate layer made of glass or plastic and a TFT (thin film transistor) substrate layer made of glass or plastic,
    wherein a liquid crystal layer or an organic layer is provided between the upper substrate layer and the lower TFT substrate layer,
    and wherein the pressure electrode is formed on a bottom surface of the TFT substrate layer.

5. The touch input device of claim 4, wherein, in the display panel, after the pressure electrode is formed on the TFT substrate layer, either the liquid crystal layer or the organic layer, and the upper substrate layer are formed.

6. The touch input device of claim 1, further comprising a touch sensor panel which detects a touch position, wherein the touch sensor panel is attached on the display panel or is disposed within the display panel.

7. The touch input device of claim 1,
    wherein the display panel is an LCD panel,
    and wherein the touch input device comprises a backlight unit between the display panel and the reference potential layer.

8. The touch input device of claim 1, wherein the display panel is an OLED panel.

9. The touch input device of claim 1, further comprising:
a cover layer which is disposed on the display panel;
wherein the pressure electrode is not formed on the circumference,
wherein, when a pressure is applied to a touch surface, the cover layer and the display panel are bent, so that the distance is changed,
and wherein the distance is changed according to a magnitude of the pressure.

10. A method for forming a pressure electrode on a display panel comprising an upper substrate layer made of glass or plastic and a TFT substrate layer made of glass or plastic, and a liquid crystal layer or an organic layer between the upper substrate layer and the TFT substrate layer,
wherein the method comprises:
forming the pressure electrode for detecting a pressure on a bottom surface of the TFT substrate layer;
forming an insulator on the formed pressure electrode;
forming a protective layer on the TFT substrate layer in which the pressure electrode and the insulator have been formed;
after forming the pressure electrode, the insulator and the protective layer on the TFT substrate layer, inverting the TFT substrate layer;
after inverting the TFT substrate layer, forming a liquid crystal layer or an organic layer on a top surface of the inverted lower TFT substrate layer; and
after forming the liquid crystal layer or the organic layer on the top surface of the inverted lower TFT substrate layer, forming the upper substrate layer on the liquid crystal layer or the organic layer.

11. The method of claim 10, wherein the forming the pressure electrode is performed by using any one of etching processes using photolithography, an etching resist, or etching paste.

12. The method of claim 10, wherein the pressure electrode is for detecting a capacitance change amount according to a change of a distance between the pressure electrode and a reference potential layer spaced apart from the pressure electrode at a predetermined distance.

13. The method of claim 12,
wherein the pressure electrode comprises a drive electrode and a receiving electrode,
and wherein the pressure electrode detects a mutual capacitance change amount between the drive electrode and the receiving electrode, which is based on the change of a distance between the pressure electrode and the reference potential layer.

14. The method of claim 12, wherein the pressure electrode detects a self-capacitance change amount according to the change of a distance between the pressure electrode and the reference potential layer.

* * * * *